United States Patent
Yoshida et al.

(10) Patent No.: US 8,251,131 B2
(45) Date of Patent: Aug. 28, 2012

(54) INJECTION COOLING HEAT EXCHANGER FOR VEHICLE ELECTRICAL COMPONENTS

(75) Inventors: Tadafumi Yoshida, Nisshin (JP); Yutaka Yokoi, Seto (JP); Hiroshi Osada, Komaki (JE)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 811 days.

(21) Appl. No.: 12/307,493

(22) PCT Filed: Jul. 10, 2007

(86) PCT No.: PCT/JP2007/064051
§ 371 (c)(1),
(2), (4) Date: Jan. 5, 2009

(87) PCT Pub. No.: WO2008/007799
PCT Pub. Date: Jan. 17, 2008

(65) Prior Publication Data
US 2009/0205802 A1    Aug. 20, 2009

(30) Foreign Application Priority Data
Jul. 11, 2006   (JP) .................................. 2006-190368

(51) Int. Cl.
*B60H 1/00* (2006.01)
*F28D 11/06* (2006.01)
*F28D 15/00* (2006.01)
*H01L 23/34* (2006.01)
*H05K 7/20* (2006.01)

(52) U.S. Cl. ..................... 165/41; 165/80.4; 165/104.33; 257/715; 361/699

(58) Field of Classification Search .................... 165/61, 165/104.33, 80.4, 80.2, 132, 259.2, 908, 165/123, 41; 239/132.5; 62/118, 239; 257/715; 361/699
See application file for complete search history.

(56) References Cited

U.S. PATENT DOCUMENTS
5,666,814 A * 9/1997 Yamamoto ...................... 62/118

FOREIGN PATENT DOCUMENTS
| | | |
|---|---|---|
| JP | 64-25447 A | 1/1989 |
| JP | 10-22428 A | 1/1998 |
| JP | 2001-135763 A | 5/2001 |
| JP | 2004-95711 A | 3/2004 |
| JP | 2005-45027 A | 2/2005 |
| JP | 2006-303264 A | 11/2006 |

* cited by examiner

*Primary Examiner* — Ljiljana Ciric
*Assistant Examiner* — Travis Ruby
(74) *Attorney, Agent, or Firm* — Sughrue Mion, PLLC

(57) ABSTRACT

A cooling device including a heat absorbing unit, provided with an inflow port of a coolant medium and a discharge port for discharging the coolant medium, sealing the coolant medium in parts other than the inflow port and the discharge port, wherein the heat absorbing unit includes an upper member having an installation surface where semiconductor elements serving as an object to be cooled are installed and a cooling surface serving as a back surface of installation surface, and a lower member forming a chamber having cooling surface as a part of a inner wall surface together with upper member. Injection ports communicating with inflow port for injecting the coolant medium toward cooling surface are provided and the discharge port is provided at a position lower than opening positions of injection ports in lower member.

6 Claims, 6 Drawing Sheets

INJECTION COOLING HEAT EXCHANGER FOR VEHICLE ELECTRICAL COMPONENTS

TECHNICAL FIELD

This invention relates to a cooling device and a vehicle provided with the device, and particularly to a cooling device for cooling an object to be cooled with a coolant medium and a vehicle provided with the device.

BACKGROUND ART

As a heating value of a semiconductor element is increased, there are a number of examples where a water-cooling type cooling device is adapted instead of an air-cooling type cooling device such as a heat sink.

FIG. 13 is a view showing an example of the water-cooling type cooling device.

With reference to FIG. 13, a cooling device 400 is to cool a semiconductor element 406. Cooling water fed from a pump 402 to a heat absorbing unit 404 is injected from an injection port 408 to the inside of a part where the semiconductor element 406 is installed so that cooling efficiency is enhanced. In such a way, there is a well-known technique that thermal transmission is facilitated in a form of a wall-surface colliding jet.

FIG. 14 is a view showing an example of a cooling device with using a conventional wall-surface colliding jet.

The cooling device as shown in FIG. 14 is disclosed in Japanese Patent Laying-Open No. 2001-135763. With reference to FIG. 14, a semiconductor element 501 is sealed by a ceramic cap or the like and connected to a ceramic substrate 502 by a very small solder ball 503. The electric power is supplied to and a signal is inputted to and outputted from semiconductor element 501 via a pad 504 connected to solder ball 503 by a wire (now shown) provided in the interior of the substrate.

A support body 507 has an opening unit 525 for housing semiconductor element 501 and supports or retains ceramic substrate 502. A pin 509 is partly provided on a surface of the support body so as to position ceramic substrate 502 relative to the support body. A spacer 508 is to feed the air between ceramic substrate 502 and support body 507.

A gap 511 is a gap between semiconductor element 501 and opening unit 525 on an upper surface of support body 507. A gap 512 is a gap between ceramic substrate 502 and support body 507 generated by spacer 508. A discharge port 514 is a discharge port for a coolant and the air provided in a casing 513.

When an electric characteristic of semiconductor element 501 is measured and evaluated or devices are divided into a non-defective item and a defective item, semiconductor element 501 is firstly set downward so as to form gap 511 relative to support body 507 in opening unit 525 for housing semiconductor element 501.

Then, the air in casing 513 is drawn out by a blower 517 and the air is taken from the upper side of support body 507 into casing 513 via gaps 512 and 511.

Next, while continuously taking the air in such a way, cooling water of a tank 516 is cooled by a heat exchanger 518 and further injected from a coolant injection nozzle 510 toward a main surface of semiconductor element 501 (a surface of the ceramic cap) by a pump 515. An arrow 519 indicates flow of the air to be suctioned into gaps 511 and 512. An arrow 520 indicates flow of the cooling water. Pump 515 for the coolant also suctions the cooling water and the air from discharge port 514. Then, the air and the water are separated from each other in tank 516.

When the air is discharged from discharge port 514 provided in casing 513 on the lower side of support body 507 to tank 516 by blower 517, the air at a normal temperature is fed from the periphery of the cooling device of FIG. 14 into gap 512 between ceramic substrate 502 and support body 507 and gap 511 between support body 507 and a side surface of semiconductor element 501. An air curtain 521 is formed around semiconductor element 501. Flow of the cooling water injected to the main surface of semiconductor element 501 and the like are pushed away to the downstream by this air curtain 521.

Since a jet is injected to such a wall surface in the gas, the speed of the jet is not weakened in comparison to injection in the liquid and heat radiation efficiency from the semiconductor element is improved.

Vehicles using the electric power as a mechanical power source such as a hybrid vehicle, an electric vehicle and a fuel-cell vehicle provided with a fuel cell attract public attention in recent years. The hybrid vehicle is a vehicle having a motor as the mechanical power source in addition to a conventional engine. The hybrid vehicle is to obtain the mechanical power by driving the engine and converting DC voltage from a DC power source into AC voltage so as to drive the motor by the converted AC voltage. The electric vehicle is to obtain the mechanical power by driving a motor by AC voltage converted from DC voltage from a DC power source.

An electric power transducer such as an inverter and a voltage boosting converter is installed in such a vehicle using the electricity as the mechanical power source. The electric power transducer to be installed in the vehicle or the like requires a large volume of the electric power in order to obtain a high mechanical performance. Since the electric power transducer with a large volume of the electric power or the like generates a large heating value, a cooling device for cooling the electric power transducer is installed.

The electric power transducer includes a plurality of power semiconductor elements. For example, the power semiconductor elements include power MOSFETs (Metal Oxide Semiconductor Field-Effect Transistors) and IGBTs (Insulated Gate Bipolar Transistors).

With regard to such a cooling device for cooling the semiconductor element to be installed in the vehicle, it is worth while examining facilitation of the thermal transmission in the form of the wall-surface colliding jet in order to improve the cooling efficiency.

However, in the example as shown in FIG. 13, when the semiconductor element to be cooled is increased to more than one, the semiconductor element installed on the downstream side of the cooling water is influenced by the cooling water injected to the other semiconductor element on the upstream side. Therefore, the cooling water is not easily injected to each of a plurality of the semiconductor elements at a uniform flow rate, and there is a fear that cooling unevenness may be caused.

The form of the wall-surface colliding jet of an open system where a casing communicates with the external air as shown in FIG. 14 is not preferable as the cooling device to be installed in the vehicle where oscillation and acceleration are added, since there is a fear that leakage of the cooling water may be caused.

Disclosure of the Invention

An object of this invention is to provide a cooling device of improving cooling efficiency and reducing cooling unevenness.

In summary, this invention is a cooling device including a heat absorbing unit, provided with an inflow port of a coolant medium and a discharge port for discharging the coolant medium, sealing the coolant medium in parts other than the inflow port and the discharge port, wherein the heat absorbing unit includes an upper member having an installation surface where an object to be cooled is installed and a cooling surface serving as a back surface of the installation surface, and a lower member forming a chamber having the cooling surface as a part of an inner wall surface together with the upper member. An injection port communicating with the inflow port for injecting the coolant medium toward the cooling surface is provided and the discharge port is provided at a position lower than an opening position of the injection port in the lower member.

Preferably, a predetermined amount of gas is enclosed in the chamber. The injection port injects the coolant medium toward the cooling surface in the gas. The discharge port is provided at a position lower than a liquid level serving as a border between the medium and the gas in the chamber.

Preferably, the lower member has a support unit provided in the circumference of the injection port for maintaining height of the injection port and radially feeding the medium to the periphery.

Preferably, the object to be cooled is a plurality of semiconductor elements, and a plurality of the injection ports are provided in the lower member respectively corresponding to parts where the plurality of the semiconductor elements are installed.

Preferably, the lower member is provided with a groove running from the circumference of the injection port to the discharge port in the interior of the chamber for guiding the medium to the discharge port, and a cross-sectional area of the groove is gradually increased from the upstream of flow of the medium to the downstream.

Preferably, the lower member is provided with a groove running from the circumference of the injection port to the discharge port in the interior of the chamber for guiding the medium to the discharge port. The cooling surface includes a first part where the medium injected from the injection port is abutted, and a second part being lower than the first part and dipped into the medium flowing in the groove.

Preferably, the cooling device further includes a pump and a heat radiator provided in series on a channel running from the discharge port to the inflow port in the exterior of the chamber.

In accordance with another aspect, this invention is a vehicle provided with the above cooling device.

According to the present invention, it is possible to prevent leakage of the coolant medium and also improve the cooling efficiency. Another advantage of the present invention is capability of improving the cooling efficiency as well as reducing the cooling unevenness in the case where there are a plurality of objects to be cooled.

BEST MODES FOR CARRYING OUT THE INVENTION

Figure 1:
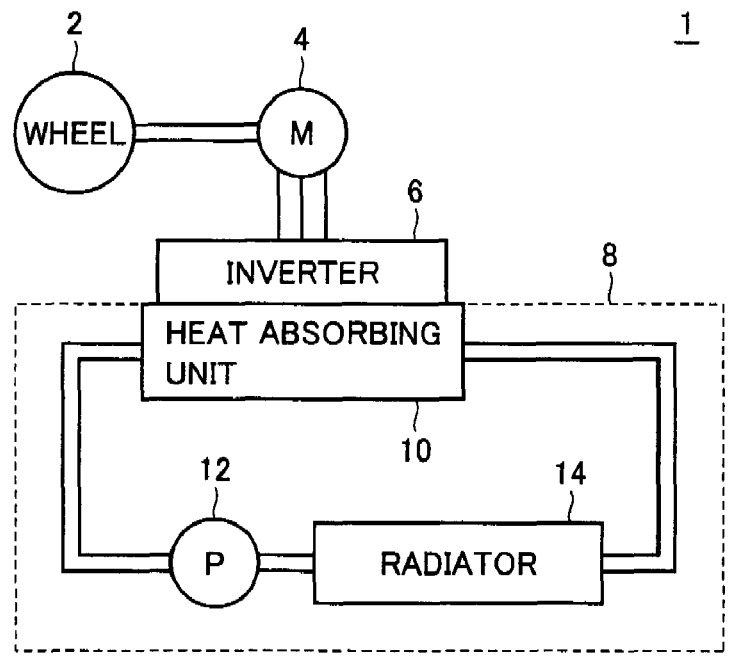
FIG. 1 is a view showing a schematic configuration of a vehicle provided with a cooling device.

Hereinafter, embodiments of the present invention will be described in detail with reference to the drawings. It should be noted that the same or corresponding parts throughout the drawings are given the same reference numerals and a description thereof will not be repeated.

First Embodiment

FIG. 1 is a view showing a schematic configuration of a vehicle provided with a cooling device.

With reference to FIG. 1, a vehicle 1 includes a wheel 2, a motor 4 for driving wheel 2, an inverter 6 for supplying a three-phase AC drive signal to motor 4, and a cooling device 8 for cooling a semiconductor element of inverter 6.

Cooling device 8 includes a heat absorbing unit 10 for absorbing heat from inverter 6, and a pump 12 and a radiator 14 both provided in series on a channel formed in the exterior of heat absorbing unit 10 for circulating a coolant medium from a discharge port of the coolant medium of the heat absorbing unit to an inflow port.

Vehicle 1 is a vehicle using the electric power as a mechanical power source such as a hybrid vehicle, an electric vehicle and a fuel-cell vehicle provided with a fuel cell.

Figure 2:
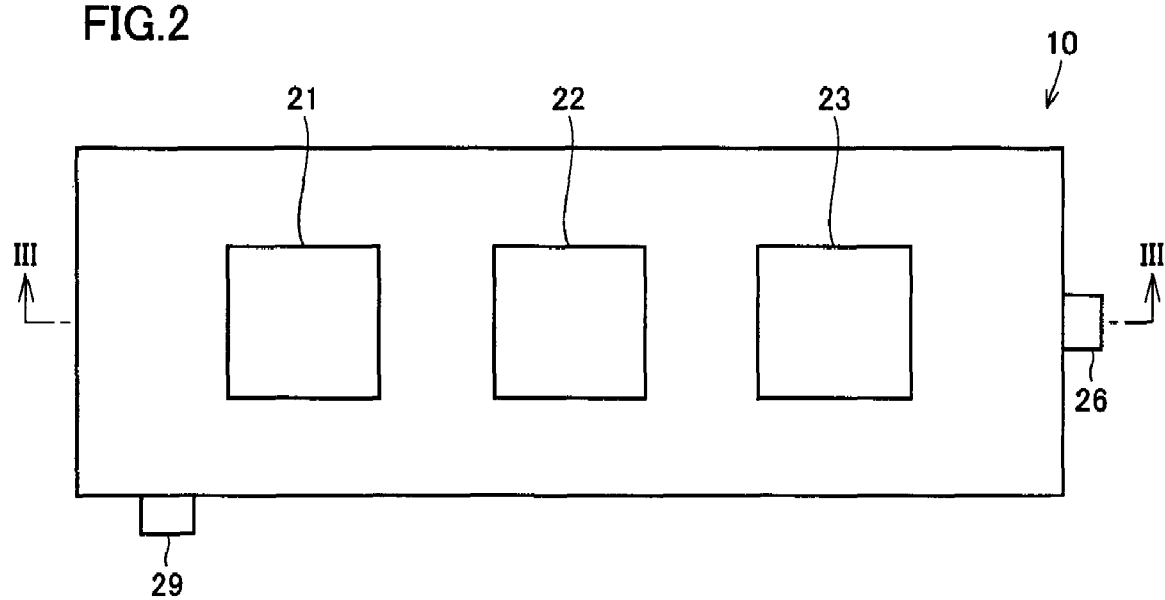
FIG. 2 is a plan view of a heat absorbing unit 10 of FIG. 1.

FIG. 2 is a plan view of heat absorbing unit 10 of FIG. 1.

Figure 3:
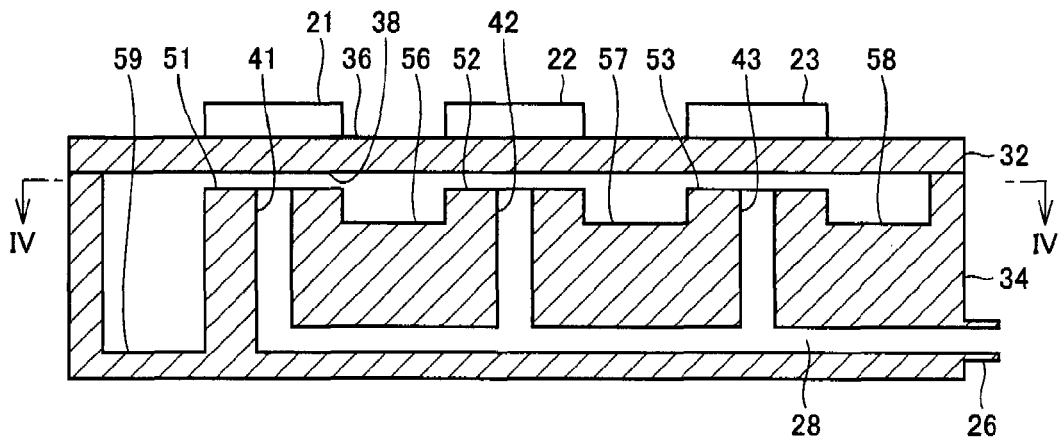
FIG. 3 is a sectional view showing a section taken along line III-III of FIG. 2.

FIG. 3 is a sectional view showing a section taken along line III-III of FIG. 2.

With reference to FIGS. 2 and 3, heat absorbing unit 10 is provided with an inflow port 26 of the coolant medium (such as cooling water) and a discharge port 29 for discharging the coolant medium and sealing the coolant medium in parts other than inflow port 26 and discharge port 29.

It should be noted that a position of discharge port 29 may be changed to a position of a discharge port 129 described later in FIGS. 9 to 12 from a view of symmetry.

Heat absorbing unit 10 includes an upper member 32 having an installation surface 36 where an object to be cooled (semiconductor elements 21 to 23) is installed, and a cooling surface 38 serving as a back surface of installation surface 36, and a lower member 34 forming a chamber having cooling surface 38 as a part of an inner wall surface together with upper member 32.

In lower member 34, injection ports 41 to 43 communicating with inflow port 26 via a flow path 28 for injecting the coolant medium toward cooling surface 38 are provided and discharge port 29 is provided at a position lower than opening positions of injection ports 41 to 43 as described later in detail in FIG. 6.

The object to be cooled is not limited but a heating element such as a plurality of semiconductor elements 21 to 23. A plurality of injection ports 41 to 43 are provided in lower member 34 respectively corresponding to parts where a plurality of semiconductor elements 21 to 23 are installed.

Figure 4:
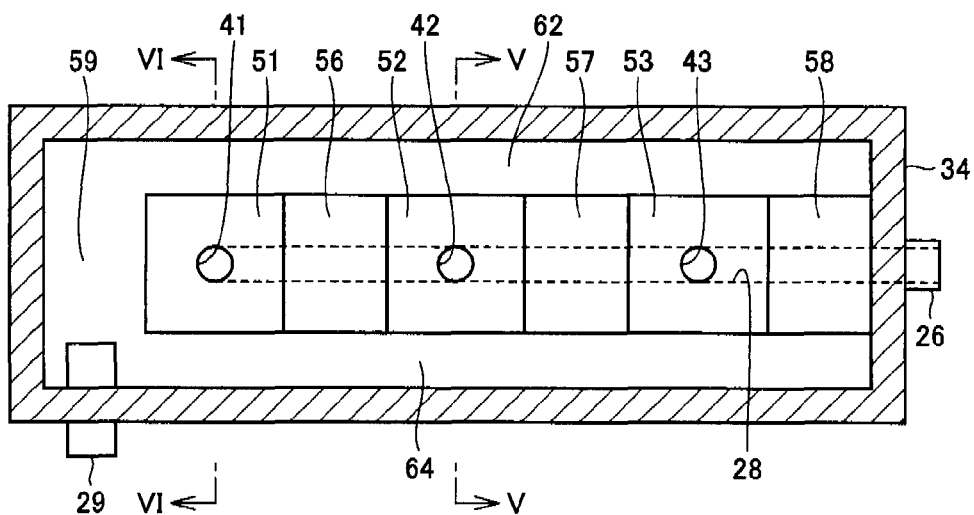
FIG. 4 is a view seeing downward from a section taken along line IV-IV of FIG. 3.

FIG. 4 is a view seeing downward from a section taken along line IV-IV of FIG. 3.

Figure 14:
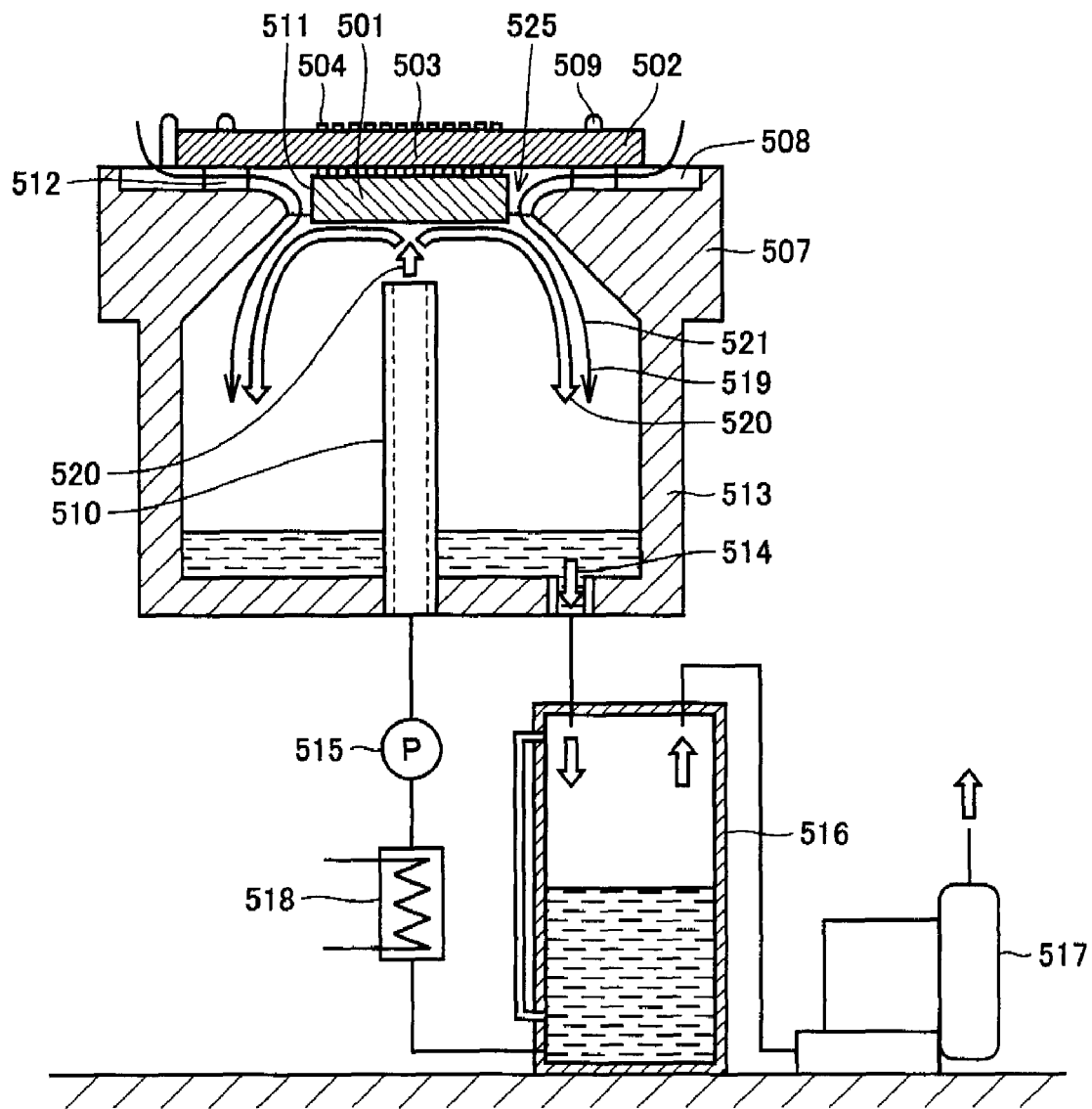
FIG. 14 is a view showing an example of a cooling device with using a conventional wall-surface colliding jet.

With reference to FIGS. 3 and 4, lower member 34 has support units 51 to 53 respectively provided in the circumference of injection ports 41 to 43 for maintaining height of injection ports 41 to 43 and radially feeding the coolant medium to the periphery. That is, an edge part in the vicinity of the injection port in a pipe shape having the injection port shown in FIG. 14 is widened in FIGS. 3 and 4. Thereby, the coolant medium is spread over a part where the heating element is installed in the vicinity of a jet colliding part and it is possible to remove the heat from the cooling surface.

Flow paths 56 to 58 provided in the periphery of support units 51 to 53 are one-step lower than support units 51 to 53. A flow path 59 and side grooves 62 and 64 are further one-step lower than flow paths 56 to 58.

Figure 5:
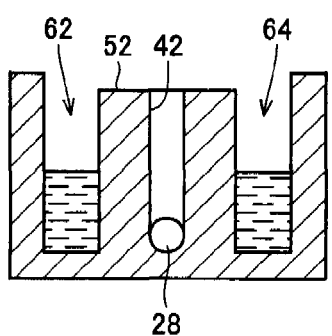
FIG. 5 is a sectional view showing a section taken along line V-V of FIG. 4.

FIG. 5 is a sectional view taken along line V-V of FIG. 4.

With reference to FIGS. 4 and 5, injection port 42 communicates with flow path 28 and injects the coolant medium supplied from flow path 28. Support unit 52 is provided in the periphery of injection port 42 and supports injection port 42 so that the injected medium is not dropped to be lower than the height of injection port 42 in the vicinity of the object to be cooled.

Side grooves 62 and 64 are provided on the both sides of support unit 52. The injected coolant medium flows in side grooves 62 and 64 and reaches discharge port 29.

Figure 6:
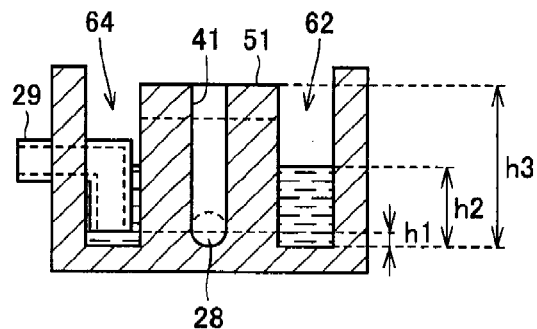
FIG. 6 is a sectional view seeing a discharge port from a section taken along line VI-VI of FIG. 4.

FIG. 6 is a sectional view seeing the discharge port from a section taken along line VI-VI of FIG. 4.

With reference to FIGS. 4 and 6, an intake port of discharge port 29 is provided at a position (height h1) lower than height h3 of support unit 51 as well as lower than height h2 of a liquid level of side grooves 62 and 64.

Figure 7:
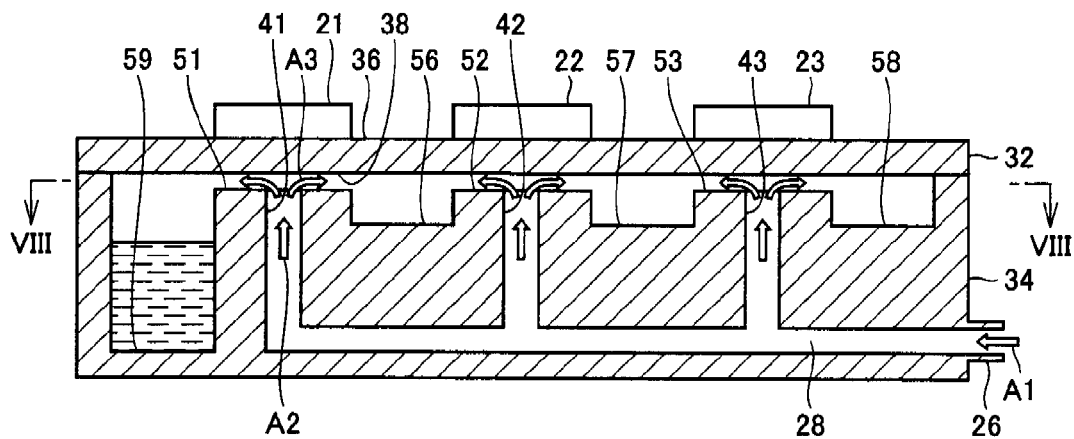
FIG. 7 is a view showing flow of a coolant medium in FIG. 3.

FIG. 7 is a view showing flow of the coolant medium in FIG. 3.

Figure 8:
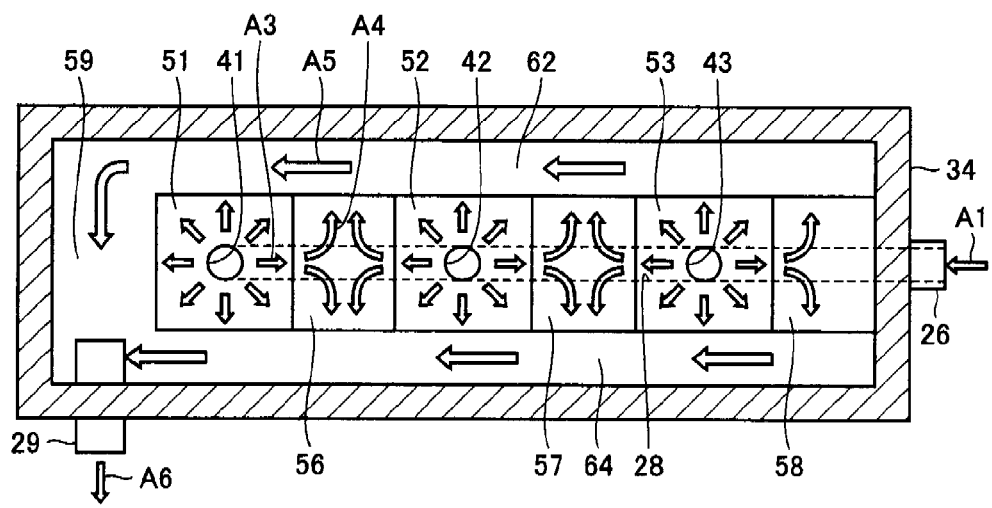
FIG. 8 is a view showing the flow of the coolant medium in FIG. 4.

FIG. 8 is a view showing the flow of the coolant medium in FIG. 4.

With reference to FIGS. 7 and 8, a predetermined amount of gas (such as the air) is enclosed in the chamber formed by upper member 32 and lower member 34. The coolant medium flowing from inflow port 26 as shown by an arrow A1 is injected from injection ports 41 to 43 toward a part where the object to be cooled is installed on cooling surface 38. At this time, injection ports 41 to 43 inject the coolant medium toward cooling surface 38 in the gas as shown by an arrow A2.

The injected medium is abutted with cooling surface 38 and then radially spread over the periphery on support units 51 to 53 forming a parallel narrow path with the cooling surface as shown by an arrow A3. At this time, in the periphery of support units 51 to 53, flow paths 56 to 58 are one-step lower than support units 51 to 53 and side grooves 62 and 64 and flow path 59 are further one-step lower than flow paths 56 to 58. Therefore, the medium flows as shown by arrows A4 and A5. The flow of the medium injected from injected port 42 does not influence over the flow of the medium respectively injected from injection ports 41 and 43 onto support units 51 and 53 at least on support units 51 and 53.

Then, the medium is discharged from discharge port 29 as shown by an arrow A6 and reaches the pump and the radiator.

As described in FIG. 6, discharge port 29 is provided at the position lower than the liquid level serving as a border between the medium and the gas in the chamber. Therefore, a predetermined amount of the gas enclosed in the chamber formed by upper member 32 and lower member 34 is not discharged but only the medium is discharged.

It should be noted that as long as the intake port of the discharge port is lower than the position of the injection port, the gas can be left in a part other than a part where the jet is abutted on the cooling surface. Therefore, the position of the intake port does not have to be as low as in FIG. 6. However, in order not to suction an air bubble generated in the case where a flow rate is high, and in order to increase an enclosing amount of the gas, the discharge port is desirably provided at the low position as shown in FIG. 6.

As mentioned above, in the cooling device shown in the first embodiment, leakage of the coolant medium is not caused even when oscillation and acceleration of the vehicle or the like are added, and the coolant medium can be supplied to the semiconductor elements serving as a plurality of the heating elements at an uniform flow rate. Therefore, cooling unevenness is reduced.

Second Embodiment

A cooling device according to a second embodiment is provided with a heat absorbing unit 110 instead of heat absorbing unit 10 in the first embodiment. Other parts are the same as the configuration described in FIG. 1 and a description thereof will not be repeated.

Figure 9:
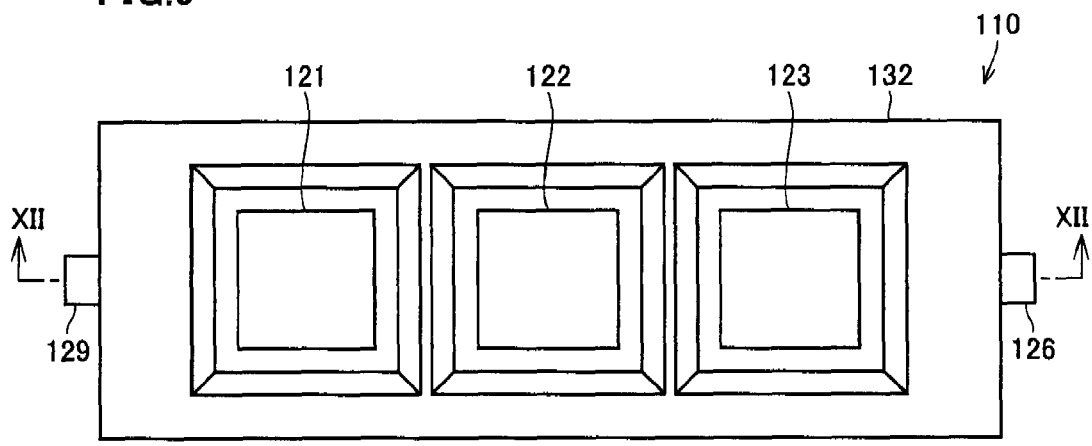
FIG. 9 is a plan view of a heat absorbing unit 110.

FIG. 9 is a plan view of heat absorbing unit 110.

Figure 10:
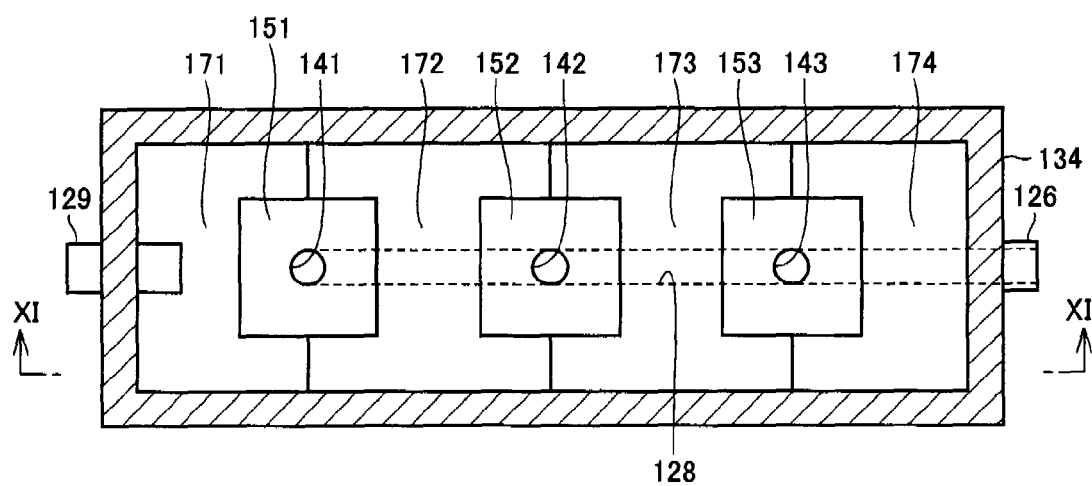
FIG. 10 is a view corresponding to FIG. 4 and a plan view showing a state that an upper member 132 of heat absorbing unit 110 is removed.

FIG. 10 is a view corresponding to FIG. 4 and a plan view showing a state that an upper member 132 of heat absorbing unit 110 is removed.

With reference to FIGS. 9 and 10, heat absorbing unit 110 is provided with an inflow port 126 of the coolant medium (such as the cooling water) and discharge port 129 for discharging the coolant medium for sealing the coolant medium in parts other than inflow port 126 and discharge port 129.

It should be noted that a position of discharge port 129 is preferably in the direction shown in FIGS. 9 to 12 from a view of symmetry but may be in the direction shown in FIGS. 1 to 8.

Heat absorbing unit 110 includes upper member 132 where the object to be cooled is installed, and a lower member 134 forming a chamber having a cooling surface as a part of an inner wall surface together with upper member 132.

Injection ports 141 to 143 communicating with inflow port 126 via a flow path 128 for injecting the coolant medium toward the cooling surface are provided in lower member 134.

The object to be cooled is not limited but the heating element such as a plurality of semiconductor elements 121 to 123. A plurality of injection ports 141 to 143 are provided in lower member 134 respectively corresponding to parts where a plurality of semiconductor elements 121 to 123 are installed.

Figure 11:
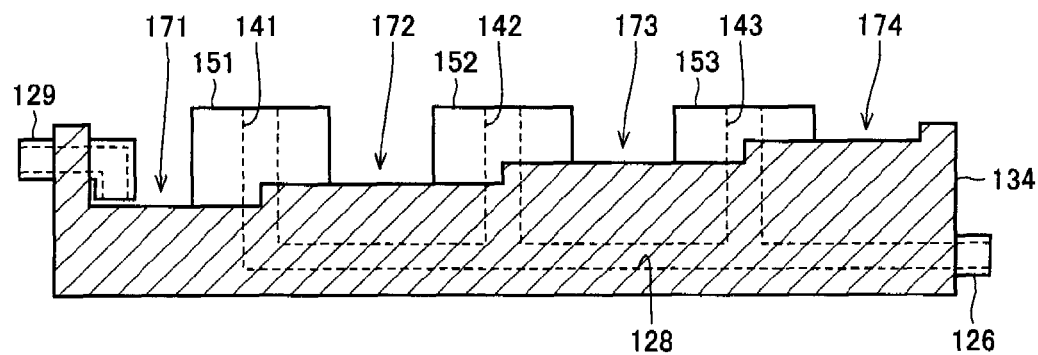
FIG. 11 is a sectional, view showing a section taken along line XI-XI of FIG. 10.

FIG. 11 is a sectional view taken along line XI-XI of FIG. 10.

With reference to FIGS. 10 and 11, discharge port 129 is provided at a position lower than opening positions of injection ports 141 to 143.

Lower member 134 has support units 151 to 153 respectively provided in the circumference of injection ports 141 to 143 for maintaining height of injection ports 141 to 143 and radially feeding the coolant medium to the periphery. Thereby, the coolant medium is spread over a part where the heating element is installed in the vicinity of a jet colliding part and it is possible to remove the heat from the cooling surface.

Flow paths 171 to 174 provided in the periphery of support units 151 to 153 are lower than support units 151 to 153. In more detail, lower member 134 is provided with flow paths 171 to 174 serving as grooves running from the circumference of injection ports 141 to 143 to discharge port 129 in the interior of the chamber formed with upper member 132 for guiding the medium to discharge port 129. Cross-sectional areas of these grooves are gradually increased from the upstream of the flow of the medium to the downstream. That is, since depth is increased in order of flow paths 174, 173, 172 and 171, the cross-sectional areas of the flow paths are increased in such order. FIGS. 10 and 11 show an example that the depth is increased step-wise. However, the depth may be increased smoothly or straightly. It should be noted that width may be widened so as to increase the cross-sectional areas instead of increasing the depth.

Since the cross-sectional areas of the flow paths are increased from the upstream side to the downstream side, the flow rate of the coolant medium flowing in the flow paths is substantially the same on the upstream side and the downstream side. Alternatively, the flow rate can be adjusted so that a degree of heat radiation is similar on the upstream side and the downstream side.

Figure 12:
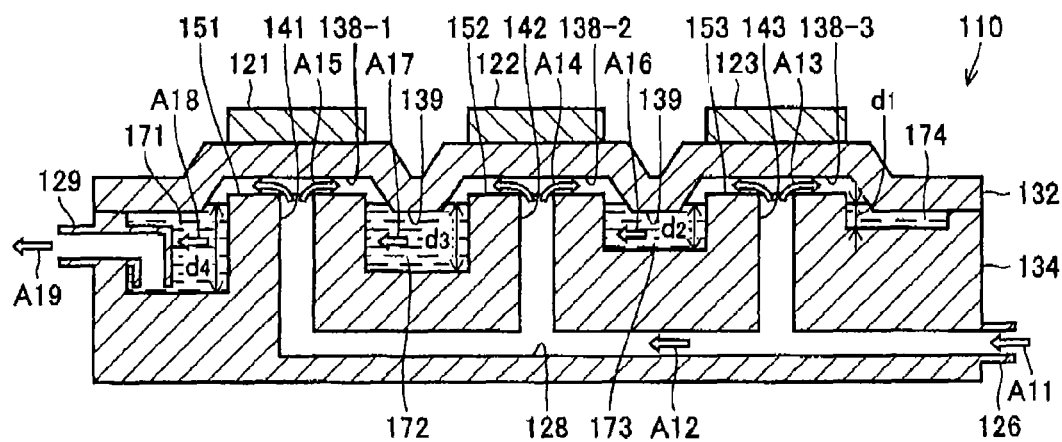
FIG. 12 is a view showing the flow of the coolant medium in heat absorbing unit 110 in a section taken along line XII-XII of FIG. 9.
Figure 13:
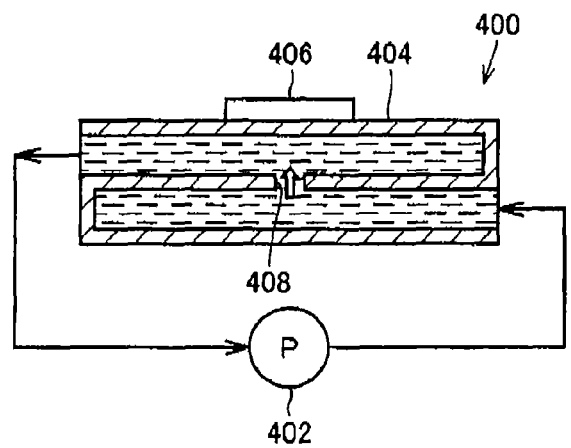
FIG. 13 is a view showing an example of a water-cooling type cooling device.

FIG. 12 is a view showing the flow of the coolant medium in heat absorbing unit 110 in a section taken along line XII-XII of FIG. 9.

With reference to FIG. 12, injection ports 141 to 143 communicate with flow path 128 and inject the coolant medium supplied from flow path 128. Support units 151 to 153 are respectively provided in the periphery of injection ports 141 to 143 and support injection ports 141 to 143 so that the injected medium is not dropped to be lower than the height of injection ports in the vicinity of the object to be cooled.

An intake port of discharge port 129 is provided at a position lower than height of support unit 151 as well as lower than height of a liquid level of flow path 171.

A predetermined amount of the gas (such as the air) is enclosed in the chamber formed by upper member 132 and lower member 134. The coolant medium flowing from inflow port 126 as shown by an arrow A11 is injected from injection ports 141 to 143 toward parts 138-1 to 138-3 where the object to be cooled is installed on the cooling surface. At this time, injection ports 141 to 143 inject the coolant medium towards parts 138-1 to 138-3 in the gas as shown by arrows A13 to A15.

The injected medium is abutted with parts 138-1 to 138-3 and then radially spread over the periphery on support units 151 to 153 forming a parallel narrow path with the cooling surface as shown by arrows A13 to A15. At this time, flow paths 171 to 174 in the circumference of support units 151 to 153 are lower than support units 151 to 153.

Therefore, the flow of the medium injected from injected port 142 does not influence over the flow of the medium respectively injected from injection ports 141 and 143 onto support units 151 and 153 on support units 151 and 153.

Then, the medium flows in flow paths 171 to 173 toward discharge port 129 as shown by arrows A16 to A18. Depth d1 from the liquid level to flow path 174, depth d2 from the liquid level to flow path 173, depth d3 from the liquid level to flow path 172, and depth d4 from the liquid level to flow path 171 are set so as to be d1<d2<d3<d4.

The medium is discharged from discharge port 129 as shown by an arrow A19 and reaches the pump and the radiator. The intake port of discharge port 129 is provided at the position lower than the liquid level serving as the border between the medium and the gas in the chamber. Therefore, a predetermined amount of the gas enclosed in the chamber formed by upper member 32 and lower member 34 is not discharged but only the medium is discharged.

It should be noted that as long as the intake port of the discharge port is lower than the position of the injection port, the gas can be left in the part other than the part where the jet is abutted on the cooling surface. Therefore, the position of the intake port does not have to be as low as in FIG. 12. However, in order not to suction the air bubble generated in the case where the flow rate is high, and in order to increase the enclosing amount of the gas, the discharge port is desirably provided at the low position as shown in FIG. 12.

Lower member 134 is provided with flow paths 171 to 174 serving as the grooves running from the circumference of injection ports 141 to 143 to discharge port 129 in the interior of the chamber for guiding the medium to discharge port 129. The cooling surface includes first parts 138-1 to 138-3 where the medium injected from the injection ports is abutted and a second part 139 lower than the first parts and dipped into the medium flowing in the grooves.

Since second part 139 is also dipped into the coolant medium, the heat transmitted from semiconductor elements 121 to 123 through upper member 132 by thermal transmission is radiated in second part 139. That is, the cooling water is used for cooling even after jet collision until the discharge in the second embodiment.

Therefore, cooling efficiency is further improved in the second embodiment in addition to the effect achieved in the first embodiment. Since the cross-sectional areas of the flow paths are more increased on the downstream as well at the time, the rate of the flow shown by arrows A16, A17 and A18 can be set so as to be substantially equal to each other or a heat radiation performance can be substantially equal to each other. Therefore, the cooling unevenness is reduced.

It should be noted that FIGS. 9 and 12 show an example that thickness of upper member 132 is constant and convex and concave parts are provided in an outer surface (an upper surface in FIG. 12) where the semiconductor elements are provided as well as an inner surface (a lower surface in FIG. 12) where the coolant medium is enclosed. However, the convex and concave parts may only be provided in the inner surface of upper member 132 and the outer surface (the upper surface in FIG. 12) of upper member 132 may be formed in a flat shape.

As mentioned above, in the cooling device shown in the second embodiment as well, the leakage of the coolant medium is not caused even when the oscillation and the acceleration of the vehicle or the like are added, and the coolant medium can be supplied to the semiconductor elements serving as a plurality of the heating elements at an uniform flow rate. Therefore, the cooling unevenness is reduced.

It should be noted that the cooling device where the three semiconductor elements are the object to be cooled has been described in the embodiments described above by showing the examples. However, the object to be cooled such as the semiconductor elements is not limited to three but the present invention can be applied to two, four or more objects to be cooled. For example, the present invention can also be applied to a configuration that six IGBTs provided in three-phase upper arms and lower arms of an inverter device and diode elements connected in parallel to the IGBTs are arranged in a matrix state.

Alternatively, the present invention can widely be applied to any cooling device for cooling a plurality of the heating elements in addition to the cooling device to be installed in the vehicle.

The embodiment disclosed here is not restrictive but an example in all respects. A scope of the present invention is not shown by the above description but claims. The present invention should include all variations within similar meanings and ranges to the claims.

The invention claimed is:

1. A cooling device comprising a heat absorbing unit, provided with an inflow port of a coolant medium and a discharge port for discharging said coolant medium, sealing said coolant medium in parts other than said inflow port and said discharge port, wherein
said heat absorbing unit includes:
an upper member having an installation surface where an object to be cooled is installed, and a cooling surface serving as a back surface of said installation surface; and
a lower member forming a chamber having said cooling surface as a part of an inner wall surface together with said upper member,
an injection port communicating with said inflow port for injecting said coolant medium toward said cooling surface is provided and said discharge port is provided at a position lower than an opening position of said injection port in said lower member,
a plurality of said injection ports are provided in said lower member respectively corresponding to parts where said plurality of semiconductor elements are installed,
said lower member is provided with a groove running from the circumference of said injection port to said discharge port in the interior of said chamber for guiding said coolant medium to said discharge port, and
cross-sectional area of said groove is increased from the inflow port of flow of said medium to the discharge port.

2. The cooling device according to claim 1, wherein
a predetermined amount of gas is enclosed in said chamber,
said injection port injects said coolant medium toward said cooling surface in said gas, and
said discharge port is provided at a position lower than a liquid level serving as a border between said coolant medium and said gas in said chamber.

3. The cooling device according to claim 1, wherein
said lower member has a support unit provided in the circumference of said injection port for radially feeding said coolant medium to the periphery by maintaining height of said injection port.

4. The cooling device according to claim 1, wherein
said cooling surface includes:
a first part where the medium injected from said injection port is abutted; and
a second part being lower than said first part and dipped into said coolant medium flowing in said groove.

5. The cooling device according to claim 1, further comprising:
a pump and a heat radiator provided in series on a channel running from said discharge port to said inflow port in the exterior of said chamber.

6. A vehicle provided with a cooling device, wherein the cooling device comprises a heat absorbing unit, provided with an inflow port of a coolant medium and a discharge port for discharging said coolant medium, sealing said coolant medium in parts other than said inflow port and said discharge port, wherein
said heat absorbing unit includes:
an upper member having an installation surface where an object to be cooled is installed, and a cooling surface serving as a back surface of said installation surface; and
a lower member forming a chamber having said cooling surface as a part of an inner wall surface together with said upper member,
an injection port communicating with said inflow port for injecting said coolant medium toward said cooling surface is provided and said discharge port is provided at a position lower than an opening position of said injection port in said lower member,
a plurality of said injection ports are provided in said lower member respectively corresponding to parts where said plurality of semiconductor elements are installed,
said lower member is provided with a groove running from the circumference of said injection port to said discharge port in the interior of said chamber for guiding said coolant medium to said discharge port, and
a cross-sectional area of said groove is increased from the inflow port of flow of said medium to the discharge port.

* * * * *